(12) United States Patent
Lee et al.

(10) Patent No.: US 8,378,352 B2
(45) Date of Patent: Feb. 19, 2013

(54) ORGANIC LIGHT-EMITTING DISPLAY DEVICE AND MANUFACTURING METHOD OF THE SAME

(75) Inventors: Yul-Kyu Lee, Yongin (KR); Chuy-Gi You, Yongin (KR); Sun Park, Yongin (KR); Jong-Hyun Park, Yongin (KR); Dae-Woo Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/103,011

(22) Filed: May 6, 2011

(65) Prior Publication Data
US 2012/0080663 A1   Apr. 5, 2012

(30) Foreign Application Priority Data
Oct. 5, 2010   (KR) .......................... 10-2010-0096913

(51) Int. Cl.
   *H01L 29/04*   (2006.01)
(52) U.S. Cl. ................ 257/59; 257/40; 257/43; 257/56; 438/29; 438/30; 438/104; 438/149; 438/160

(58) Field of Classification Search .................. None
   See application file for complete search history.

(56) References Cited

U.S. PATENT DOCUMENTS

2010/0193790 A1   8/2010   Yeo et al.
2012/0001182 A1*  1/2012   Choi et al. ..................... 257/59

FOREIGN PATENT DOCUMENTS

| KR | 10-2006-0057945 | 5/2006 |
| KR | 10-2009-0120698 | 11/2009 |
| KR | 10-2010-0028952 | 3/2010 |
| KR | 10-2010-0088269 | 8/2010 |

* cited by examiner

*Primary Examiner* — Kyoung Lee
(74) *Attorney, Agent, or Firm* — Knobbe Martens Olson & Bear, LLP

(57) ABSTRACT

An organic light-emitting display device and a method of manufacturing the organic light-emitting display device are disclosed. The organic light-emitting display device includes a bottom capacitor electrode that is formed over the same plane as an active layer of a thin film transistor and includes a semiconductor doped with ion impurities, a pixel electrode, and a top capacitor electrode formed over the same plane as a gate electrode, wherein a contact hole entirely exposing the pixel electrode and the top capacitor electrode is formed.

25 Claims, 10 Drawing Sheets

PXL 1

PXL 2

ORGANIC LIGHT-EMITTING DISPLAY DEVICE AND MANUFACTURING METHOD OF THE SAME

CROSS-REFERENCE TO RELATED PATENT APPLICATION

This application claims the benefit of Korean Patent Application No. 10-2010-0096913, filed on Oct. 5, 2010, in the Korean Intellectual Property Office, the disclosure of which is incorporated herein in its entirety by reference.

BACKGROUND

1. Field

The present invention relates to organic light-emitting display devices and methods of manufacturing the same.

2. Description of the Related Technology

Organic light-emitting display devices are typically lightweight and thin, and have wide viewing angles, short response times, and reduced power consumption, and thus are of great interest as next-generation display devices.

SUMMARY

One or more embodiments of the present invention provide organic light-emitting display devices having excellent signal transmission characteristics and an excellent aperture ratio, and simplified methods of manufacturing the same.

According to an aspect of the present invention, there is provided an organic light-emitting display device comprising: an active layer of a thin film transistor and a bottom capacitor electrode formed over a substrate, wherein the bottom capacitor electrode includes a semiconductor material that is formed on the same layer as the active layer and doped with ion impurities: a first insulation layer formed over the substrate to cover the active layer and the bottom capacitor electrode; a gate electrode formed over the first insulation layer, wherein the gate electrode comprises a first gate electrode and a second gate electrode that are sequentially stacked on the first insulation layer, wherein the first gate electrode comprises a transparent conductive material, and the second gate electrode comprises a metal; a pixel electrode that is formed over the first insulation layer, wherein the pixel electrode comprises a transparent conductive material, and a top capacitor electrode that is formed on the same layer as the pixel electrode, wherein the top capacitor electrode comprises a transparent conductive material; source and drain electrodes of the thin film transistor that are electrically connected to the active layer; a second insulation layer that is formed between the first insulation layer and the source and drain electrodes and includes a first contact hole exposing the entire top capacitor electrode; a third insulation layer that is formed over the second insulation layer and exposes the pixel electrode; an emissive layer formed over the pixel electrode; and an opposite electrode disposed to face the pixel electrode, wherein the emissive layer is disposed between the pixel electrode and the opposite electrode.

The first gate electrode, the pixel electrode, and the top capacitor electrode may comprise the same transparent conductive material.

A gap may be formed between an outer side of the top capacitor electrode and an inner sidewall of the contact hole.

A third insulation layer may be disposed in the gap.

A capacitor wiring connected to the bottom capacitor electrode may be formed on the same layer as the bottom capacitor electrode, wherein the capacitor wiring comprises a semiconductor material doped with ion impurities.

A connection portion between the bottom electrode and the capacitor wiring may be doped with ion impurities.

The connection portion may correspond to the position of the gap formed between the outer side of the top capacitor electrode and the contact hole.

The second insulation layer may comprise a second contact hole exposing the entire pixel electrode.

A gap may be formed between an outer side of the pixel electrode and an inner sidewall of the second contact hole.

The third insulation layer may comprise an organic insulation material.

The active layer may comprise a semiconductor material doped with ion impurities.

The semiconductor material may include amorphous silicon or crystalline silicon.

The opposite electrode may be a reflective electrode that reflects light emitted from the emissive layer.

At least one insulation layer having a different refractive index from the first insulation layer may be disposed between the substrate and the first insulation layer.

According to another aspect of the present invention, there is provided a method of manufacturing an organic light-emitting display device, the method comprising: a first mask operation comprising forming a semiconductor layer over a substrate and patterning the semiconductor layer to form an active layer of a thin film transistor and a bottom capacitor electrode; a second mask operation comprising forming a first insulation layer over the substrate to cover the active layer and the bottom capacitor electrode, sequentially stacking a transparent conductive material and a first metal on the first insulation layer, and patterning the transparent conductive material and the first metal to sequentially form a pixel electrode in which the transparent conductive material and the first metal are sequentially stacked, a gate electrode of the thin film transistor, and a top capacitor electrode; a third mask operation comprising forming a second insulation layer on a resultant product of the second mask operation and patterning the second insulation layer to form a contact hole entirely exposing the pixel electrode, source and drain areas of the active layer, and the top capacitor electrode; a fourth mask operation comprising forming a second metal on a resultant product of the third mask operation, patterning the second metal to form source and drain electrodes respectively contacting the exposed source and drain areas, and removing the first metal formed on the pixel electrode and the top capacitor electrode; and a fifth mask operation comprising forming a third insulation layer on a resultant product of the fourth mask operation, wherein the third insulation layer exposes the transparent conductive material of the pixel electrode.

BRIEF DESCRIPTION OF THE DRAWINGS

The above and other features and advantages of the present invention will become more apparent by describing in detail certain embodiments thereof with reference to the attached drawings in which.

DETAILED DESCRIPTION

The present invention will now be described more fully with reference to the accompanying drawings, in which certain embodiments of the invention are shown.

Figure 1:
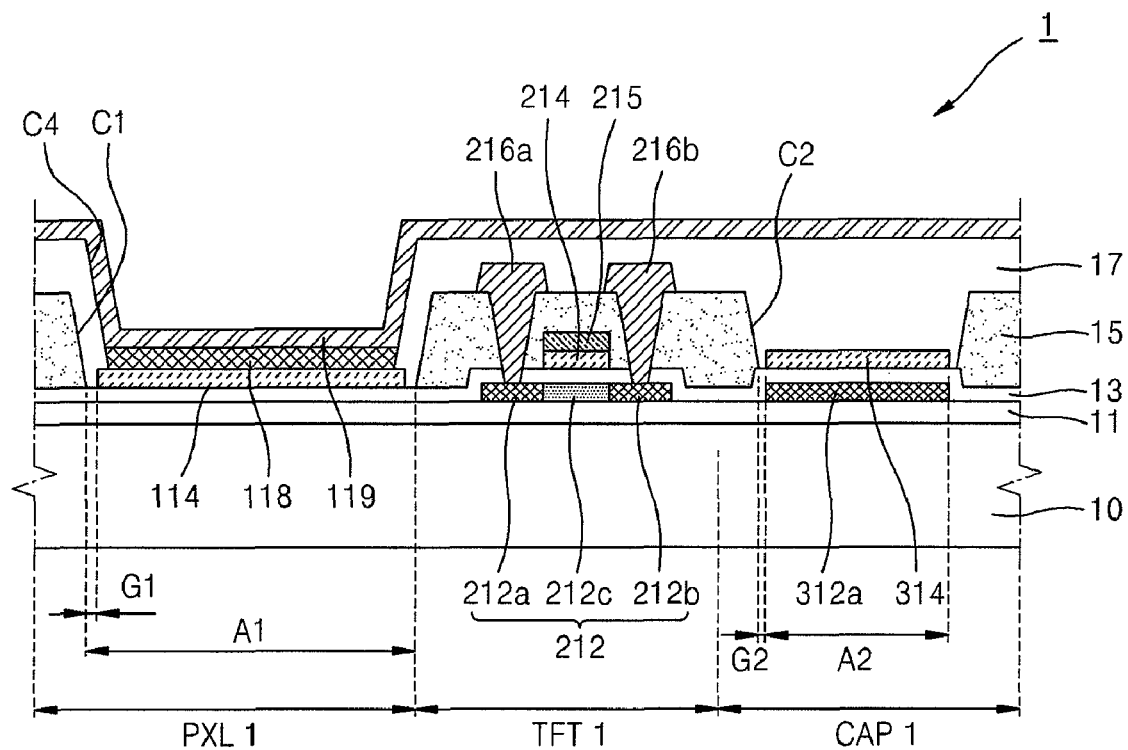
FIG. 1 is a cross-sectional view illustrating an organic light-emitting display device according to an embodiment of the present invention.
Figure 2:
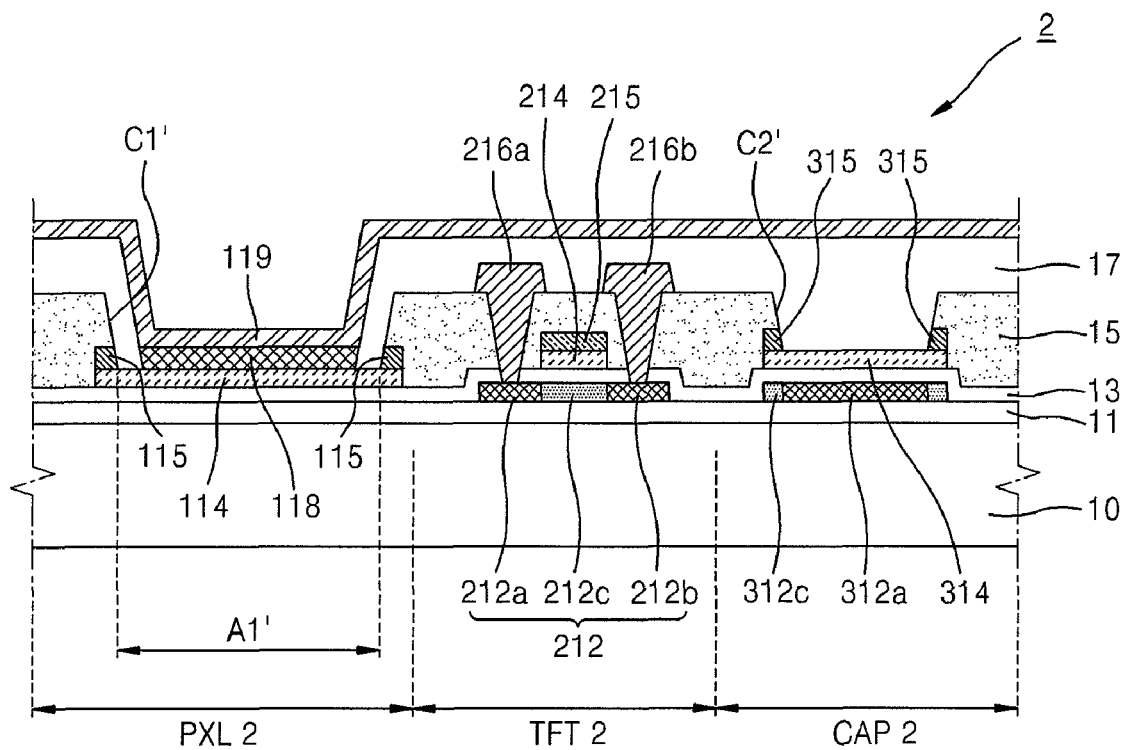
FIG. 2 is a cross-sectional view illustrating an organic light-emitting display device according to a comparative example of the present invention.

FIG. 1 is a cross-sectional view illustrating an organic light-emitting display device 1 according to an embodiment of the present invention. FIG. 2 is a cross-sectional view illustrating an organic light-emitting display device 2 according to a comparative example of the present invention.

Referring to FIG. 1, a pixel area PXL1 including an emissive layer 118, a transistor area TFT1 including a thin film transistor, and a capacitor area CAP1 including a capacitor are formed on a substrate 10 of the organic light-emitting display device 1.

Referring to FIG. 2, a pixel area PXL2 including an emissive layer 118, a transistor area TFT2 including a thin film transistor, and a capacitor area CAP2 including a capacitor are formed on a substrate 10 of the organic light-emitting display device 2.

Referring to FIG. 1, an active layer 212 is formed on the substrate 10 and a buffer layer 11 of the transistor area TFT1. The active layer 212 may be formed of a semiconductor, such as an amorphous silicon or crystalline silicon, and may include a channel area 212c, and source and drain areas 212a and 212b respectively formed at outer sides of the channel area 212c and doped with ion impurities.

A first gate electrode 214 and a second gate electrode 215 may be sequentially formed on the active layer 212, with a first insulation layer 13, which is a gate insulation layer, interposed therebetween. The first gate electrode 214 and the second gate electrode 215 can each include a transparent conductive material disposed at a position corresponding to the channel area 212c of the active layer 212.

Source and drain electrodes 216a and 216b respectively contacting the source and drain areas 212a and 212b of the active layer 212 may be respectively formed on the first and second gate electrodes 214 and 215, with a second insulation layer 15, which is an interlayer insulation layer, interposed therebetween.

A third insulation layer 17 may be formed on the second insulation layer 15 so as to cover the source and drain electrodes 216a and 216b. The third insulation layer 17 may be formed of an organic insulation layer.

Referring to FIG. 2, the transistor area TFT2 according to the comparative example has the same structure as that of the transistor area TFT1.

Referring to FIG. 1 again, a first pixel electrode 114 formed of the same transparent conductive material as the first gate electrode 214 may be formed on the first insulation layer 13 in the pixel area PXL1 according to the current embodiment of the present invention. The transparent conductive material may be at least one material selected from the group consisting of indium tin oxide (ITO), indium zinc oxide (IZO), zinc oxide (ZnO), indium oxide (In2O3), indium gallium oxide (IGO), and aluminum zinc oxide (AZO).

The emissive layer 118 may be formed on the first pixel electrode 114, and light emitted from the emissive layer 118 may be emitted through the first pixel electrode 114, which may be formed of the transparent conductive material, toward the substrate 10.

The buffer layer 11 and the first insulation layer 13 disposed below the first pixel electrode 114 may be formed of materials having different refractive indices and thus can function as a distributed Bragg reflector (DBR), thereby increasing the light efficiency of light emitted from the emissive layer 118. The buffer layer 11 and the first insulation layer 13 may be formed of, for example, $SiO_2$ or $SiN_x$. The buffer layer 11 and the first insulation layer 13 illustrated in FIG. 1 can each be formed as a single layer but are not limited thereto; that is, the buffer layer 11 and the first insulation layer 13 may be each formed of a plurality of layers.

The second insulation layer 15 may be formed on the first insulation layer 13 and at outer ends of the first pixel electrode 114, and a first contact hole C1 exposing the entire first pixel electrode 114 may be formed in the second insulation layer 15. A predetermined first gap G1 may be formed between an outer side of the first pixel electrode 114 and an inner sidewall of the first contact hole C1. The third insulation layer 17 may be formed in the first gap G1. When the third insulation layer 17 is formed of an organic insulation layer, the first gap G1 may be filled with the organic insulation layer, thereby preventing a short circuit that may occur between an opposite electrode 119 and the first pixel electrode 114.

In FIG. 1, the third insulation layer 17 formed in the first gap G1 can directly contact a flat upper surface of the buffer layer 11. However, the present embodiment of the present invention is not limited thereto. That is, when etching the second insulation layer 15 in order to form the first gap G1, the first insulation layer 13 disposed under the second insulation layer 15 may be affected by an etchant or an etching method of the second insulation layer 15. For example, an undercut may occur as the first insulation layer 13 is over-etched. Furthermore, the buffer layer 11 under the first insulation layer 13 may also be over-etched. Also in this case, the third insulation layer 17 may fill the over-etched portions to minimize influences due to over-etching.

The third insulation layer 17 may be formed on the first insulation layer 13 and the first pixel electrode 114, and an opening C4 exposing an upper portion of the first pixel electrode 114 may be formed in the third insulation layer 17. The emissive layer 118 may be formed on the exposed upper portion of the first pixel electrode 114 in the opening C4.

The emissive layer 118 may be a low molecular weight organic material or a polymer organic material. When the emissive layer 118 is a low molecular weight organic material, a hole transport layer (HTL), a hole injection layer (HIL), an electron transport layer (ETL), and an electron injection layer (EIL) may be stacked with respect to the emissive layer 118. Examples of a low molecular weight organic material include copper phthalocyanine (CuPc), N,N'-Di(naphthalene-1-yl)-N, N'-diphenyl-benzidine (NPB), and tris-8-hydroxyquinoline aluminum (Alq3).

When the emissive layer 118 is formed of a polymer organic material, a HTL may be further formed in addition to the emissive layer 118. The HTL may be formed of poly-(2, 4)-ethylene-dihydroxy thiophene (PEDOT) or polyaniline (PANI). Here, polymer organic materials, such as poly-phenylene vinylene (PPV)-based or polyfluorene-based polymer organic materials, may be used.

The opposite electrode 119 may be deposited on the emissive layer 118 as a common electrode. In the case of the organic light-emitting display device 1, the first pixel electrode 114 may be used as an anode, and the opposite electrode 119 may be used as a cathode. However, the polarities of the electrodes may obviously be reversed.

The opposite electrode 119 may be formed of a reflective electrode including a reflective material. The opposite electrode 119 may include at least one material selected from the group consisting of Al, Mg, Li, Ca, LiF/Ca, and LiF/Al.

As the opposite electrode 119 is formed of a reflective electrode, light emitted from the emissive layer 118 may be reflected by the opposite electrode 119, transmitted through the first pixel electrode 114 that is formed of a transparent conductive material, and emitted toward the substrate 10.

Referring to FIG. 2, in the pixel area PXL2 according to the comparative example, a first pixel electrode 114 formed of the same transparent conductive material as a first gate electrode 214 may be formed on a first insulation layer 13, and a second pixel electrode 115 formed of the same metal as a second gate electrode 215 may be formed on outer portions of the first pixel electrode 114.

In other words, unlike the pixel area PXL1 of the present embodiment of the present invention, a portion of the second pixel electrode 115 may remain on the outer portions of the first pixel electrode 114 in the pixel area PXL2 of the comparative example, and thus aperture ratios of the pixel areas PXL1 and PXL2 may be different. This will be described with reference to FIGS. 3A, 3B, 4A, and 4B.

Figure 3A:
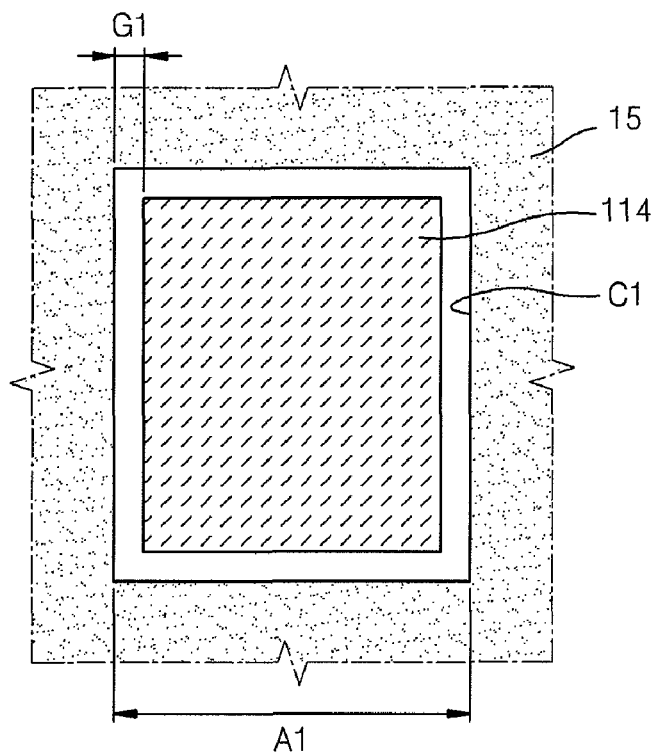
FIG. 3A is a plan view illustrating a pixel area of the organic light-emitting display device according to an embodiment of the present invention.
Figure 3B:
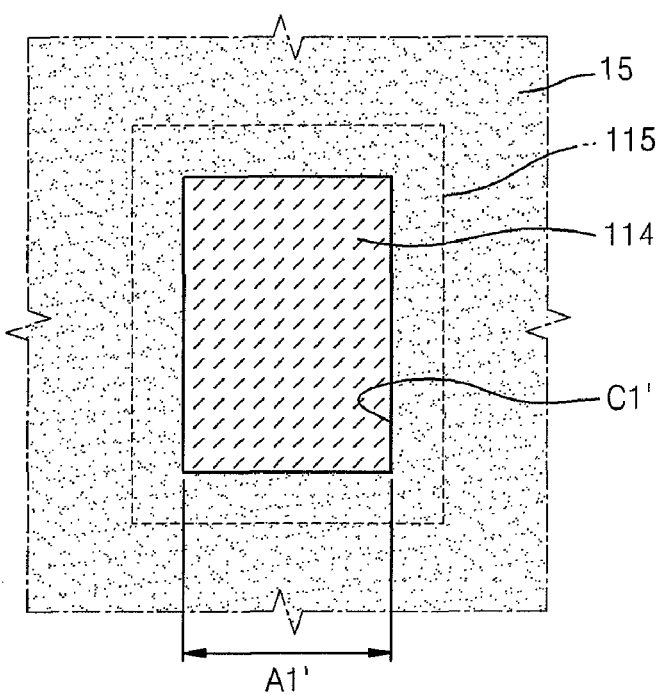
FIG. 3B is a plan view illustrating a pixel area of the organic light-emitting display device according to an comparative example of the present invention.
Figure 4A:
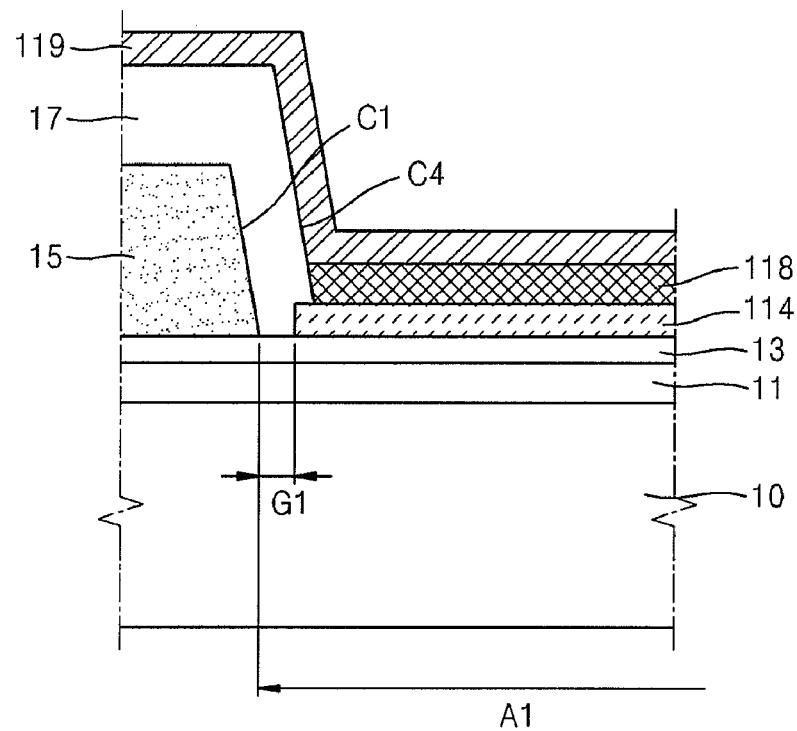
FIG. 4A is a cross-sectional view illustrating a pixel area of the organic light-emitting display device according to an embodiment of the present invention.
Figure 4B:
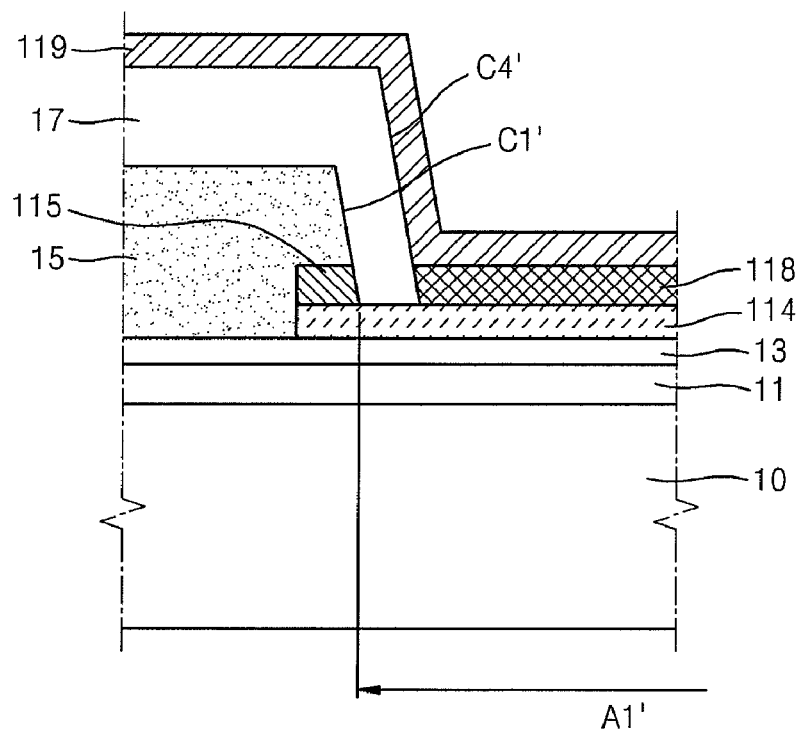
FIG. 4B is a cross-sectional view illustrating a pixel area of the organic light-emitting display device according to a comparative example of the present invention.

FIG. 3A and FIG. 4A are a plan view and a cross-sectional view illustrating the pixel area PXL1 of the organic light-emitting display device 1, respectively. FIG. 3B and FIG. 4B are a plan view and a cross-sectional view illustrating the pixel area PXL2 of the organic light-emitting display device 2 according to the comparative example, respectively.

Referring to FIGS. 3A and 4A, the first contact hole C1 exposing the entire first pixel electrode 114 may be formed in the second insulation layer 15, and the first gap G1 may be formed between the outer side of the first pixel electrode 114 and the inner sidewall of the first contact hole C1. As described above, the emissive layer 118 may be formed on the exposed upper portion of the first pixel electrode 114 in the opening C4 of the third insulation layer 17, and the opening C4 of the third insulation layer 17 may be formed in an area A1 formed by the first contact hole C1 formed in the second insulation layer 15, and thus when the area A1 formed by the first contact hole C1 is increased, a light-emission area can be increased. In other words, an aperture ratio is increased.

However, referring to FIGS. 3B and 4B, in the comparative example, the second pixel electrode 115 may remain on outer portions of the first pixel electrode 114, and thus a first contact hole C1' that exposes not the entire first pixel electrode 114 but a portion of the first pixel electrode 114 may be formed in the second insulation layer 15. A third insulation layer 17 may be formed on the second insulation layer 15 and the first pixel electrode 114, and an opening C4' exposing an upper portion of the first pixel electrode 114 may be formed in the third insulation layer 17, and the emissive layer 118 may be formed on the exposed upper portion of the first pixel electrode 114 in the opening C4'. The opening C4' of the third insulation layer 17 according to the comparative example may be formed inside an area A1' formed by the first contact hole C1' formed in the second insulation layer 15. Accordingly, when the surface area of the first pixel electrode 114 is maintained the same, the area A1' formed by the first contact hole C1' of the organic light-emitting display device 2 may be smaller than the area A1 formed by the first contact hole C1 of the organic light-emitting emitting display device 1. Thus, a light-emission area of the pixel area PXL2 according to the comparative example is reduced. In other words, an aperture ratio is reduced.

Referring to FIG. 1 again, in the capacitor area CAP1 according to an embodiment of the present invention, a bottom capacitor electrode 312a, the first insulation layer 13 covering the bottom capacitor electrode 312a, and a top capacitor electrode 314, including the same transparent conductive material as the first pixel electrode 114, are sequentially formed on the buffer layer 11.

The bottom capacitor electrode 312a may be formed of the same material as the source and drain areas 212a and 212b of the active layer 212 of the thin film transistor and may include a semiconductor doped with ion impurities. When the bottom capacitor electrode 312a is formed of an intrinsic semiconductor that is not doped with ion impurities, the capacitor may have a metal oxide semiconductor (MOS) capacitor structure with the top capacitor electrode 314. However, when the bottom capacitor electrode 312a is formed of a semiconductor doped with ion impurities, the capacitor may have a metal-insulator-metal (MIM) capacitor structure which has a higher electrostatic capacity than the MOS capacitor structure, and thus the electrostatic capacity may be maximized. Accordingly, the same amount of electrostatic capacity may be obtained using the MIM capacitor structure having a smaller area than the MOS capacitor structure, and thus a margin for reducing a surface area of the capacitor may be increased. Thus an aperture ratio may be increased by forming the first pixel electrode 114 with a large surface.

The second insulation layer 15 may be formed on the first insulation layer 13 and at outer ends of the top capacitor electrode 314, and a second contact hole C2 exposing the entire top capacitor electrode 314 may be formed in the second insulation layer 15. Here, a predetermined gap G2 may be formed between an outer side of the top capacitor electrode 314 and an inner sidewall of the second contact hole C2. The third insulation layer 17 may be formed in an area where the second gap G2 is formed. When the third insulation layer 17 is formed of an organic insulation material, the second gap G2 may be filled with the organic insulation material, thereby preventing a short circuit which may occur between the bottom capacitor electrode 312a and the top capacitor electrode 314. Also, as an organic insulation material having a small permittivity may be interposed between the opposite electrode 119 and the top capacitor electrode 314, parasitic capacitance that may occur between the opposite electrode 119 and the top capacitor electrode 314 may be reduced, thereby preventing signal disturbance due to the parasitic capacitance.

Although not shown in FIG. 1, a wiring unit W1 (see FIG. 5A) connected to the bottom capacitor electrode 312a may be disposed on the same layer as the bottom capacitor electrode 312. Like the bottom capacitor electrode 312a, the wiring unit W1 may also include a semiconductor doped with ion impurities.

Referring to FIG. 2 again, in the capacitor area CAP2 according to the comparative example, a bottom capacitor electrode 312a formed of the same material as the active layer 212 of the thin film transistor, the first insulation layer 13 covering the bottom capacitor electrode 312a, a first top capacitor electrode 314 including a transparent conductive material as that of the first gate electrode 214, and a second top capacitor electrode 315 formed of the same material as the second gate electrode 215 may be formed on outer portions of the first top capacitor electrode 314.

That is, unlike the capacitor area CAP1 of the present embodiment of the present invention, in the capacitor area CAP2 of the comparative example, a portion of the second top capacitor electrode 315 can remain on outer portions of the first top capacitor electrode 314, and thus the electrostatic capacity of the capacitor areas CAP1 and CAP2 may be different. In addition, signal transmission quality of wirings connected to the capacitors may vary. This will be described with reference to FIGS. 5A, 5B, 6A, and 6B.

Figure 5A:
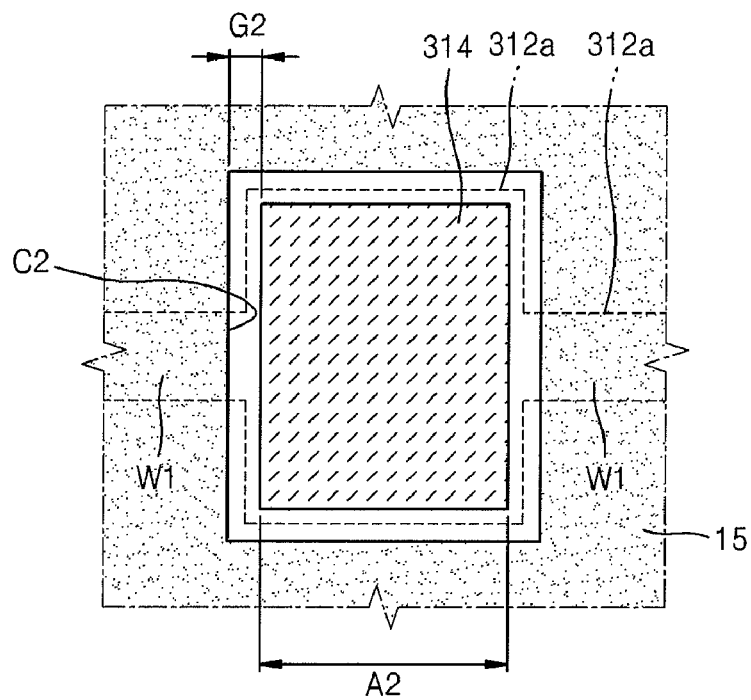
FIG. 5A is a plan view illustrating a capacitor area of the organic light-emitting display device according to a embodiment of the present invention.
Figure 5B:
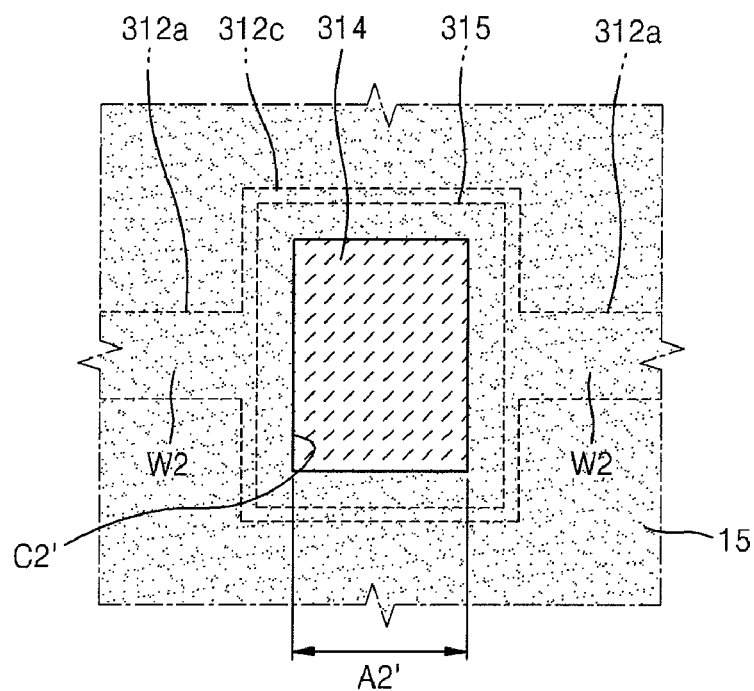
FIG. 5B is a plan view illustrating a capacitor area of the organic light-emitting display device according to a comparative example of the present invention.
Figure 6A:
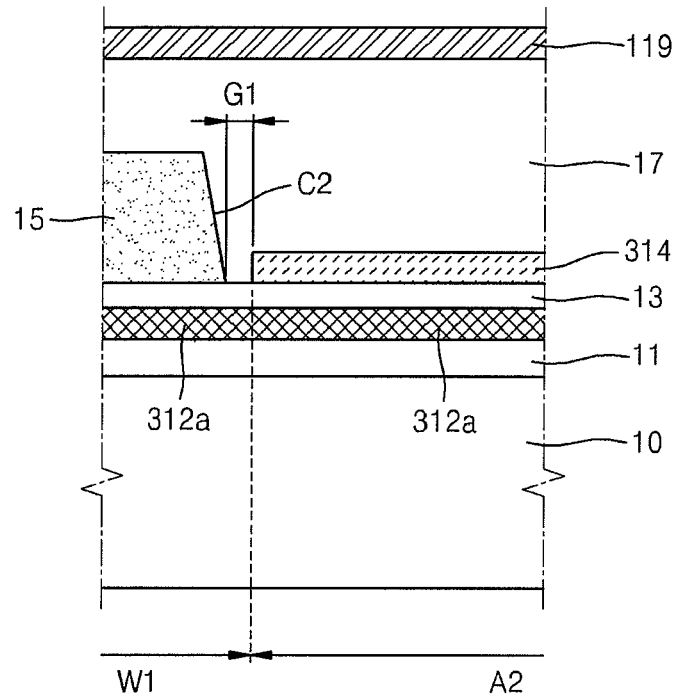
FIG. 6A is a cross-sectional view illustrating a capacitor area of the organic light-emitting display device according to a embodiment of the present invention.
Figure 6B:
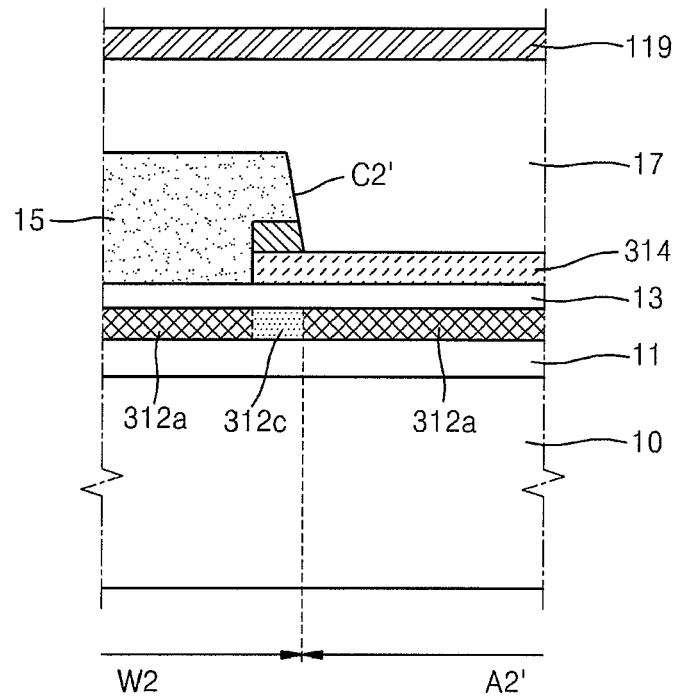
FIG. 6B is a cross-sectional view illustrating a capacitor area of the organic light-emitting display device according to a comparative example of the present invention.

FIG. 5A and FIG. 6A are a plan view and a cross-sectional view illustrating the capacitor area CAP1 of the organic light-emitting display device 1 according to the present embodiment of the present invention, respectively. FIG. 5B and FIG. 6B are a plan view and a cross-sectional view illustrating the capacitor area CAP2 of the organic light-emitting display device 2 according to the comparative example of the present invention, respectively.

Referring to FIGS. 5A and 6A, according to the current embodiment, the second contact hole C2 exposing the entire top capacitor electrode 314 may be formed in the second insulation layer 15, and the second gap G2 may be formed between the outer side of the top capacitor electrode 314 and the inner sidewall of the second contact hole C2.

As will be described later, areas to be doped with ion impurities of the bottom capacitor electrode 312a and the wiring unit W1 connected to the bottom capacitor electrode 312a can vary according to a size of the area A2 formed by the second contact hole C2 formed in the second insulation layer 15. When a size of the top capacitor electrode 314 exposed by the second contact hole C2 is smaller than a size of the bottom capacitor electrode 312a, there may be areas of a semiconductor layer of an outer portion of the bottom capacitor electrode 312a and of a connection portion between the bottom capacitor electrode 312a and the wiring unit W1 that are not doped with ions. In this case, the capacity of the capacitor may be reduced or signal transmission quality may be decreased.

However, according to the current embodiment, the entire top capacitor electrode 314 may be exposed through the second contact hole C2, and thus the bottom capacitor electrode 312a and the wiring unit W1 may be both doped with ion impurities. Accordingly, there is no area in the bottom capacitor electrode 312a and the wiring unit W1 that is not doped with ions, and thus the electrostatic capacity may be increased and the signal transmission quality may be improved.

However, referring to FIGS. 5B and 6B, in the capacitor area CAP2 according to the comparative example, the second top capacitor electrode 315 may remain on outer portions of the first top capacitor electrode 314, and thus a second contact hole C2' not exposing the entire top capacitor electrode 314 but only a portion of the first top capacitor electrode 314 may be formed in the second insulation layer 15. Consequently, the area A2' formed by the second contact hole C2' may be smaller than the area A2 formed by the second contact hole C2 of the above-described organic light-emitting display device 1, and thus an area of the bottom capacitor electrode 312a that is doped with ion impurities in the comparative example may be less than that of the present embodiment. Accordingly, electrostatic capacity may be reduced. In particular, a portion 312c of the bottom capacitor electrode 312a that is not doped with ions may be part of the connection portion between the wiring unit W1 and the bottom capacitor electrode 312a, which may decrease the signal transmission quality of the wiring unit W1 of the capacitor.

Hereinafter, a method of manufacturing the organic light-emitting display device 1 will be described with reference to FIGS. 7 through 13.

Figure 7:
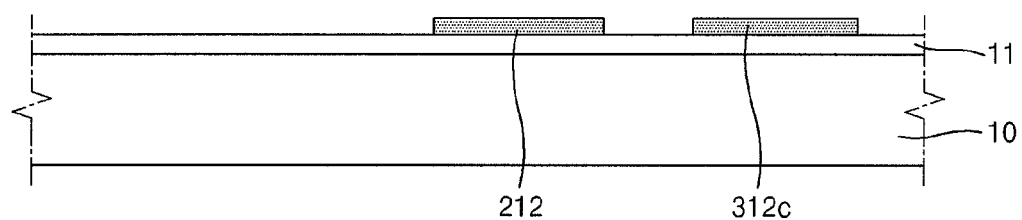
FIGS. 7 through 13 are cross-sectional views illustrating a method of manufacturing the organic light-emitting display device according to an embodiment of the present invention.

FIG. 7 is a cross-sectional view illustrating a first mask operation of the method of manufacturing the organic light-emitting display device 1 according to an embodiment of the present invention.

Referring to FIG. 7, an active layer 212 of a thin film transistor and a bottom capacitor electrode 312 are formed on a substrate 10, on which a buffer layer 11 is stacked. Although not shown in FIG. 7, a wiring unit of a capacitor connected to the bottom capacitor electrode 312c may be formed at the same time with the bottom capacitor electrode 312c in the first mask operation.

The substrate 10 may be formed of a transparent glass material having $SiO_2$ as a main component, and the buffer layer 11, which includes $SiO_2$ and/or $SiN_x$, may be further formed on the substrate 10 so that the substrate 10 is flat and so as to inhibit penetration of impurity elements into the substrate 10.

Although not shown in FIG. 7, a semiconductor layer (not shown) may be deposited on the buffer layer 11, and then a phororesist (not shown) may be coated on the semiconductor layer (not shown), and then the semiconductor layer (not shown) may be patterned using a photolithography process using a first photomask (not shown), and thus the active layer 212 of the thin film transistor, the bottom capacitor electrode 312c, and the wiring unit of the capacitor (not shown) may be formed at the same time.

The first mask operation using photolithography may involve exposing the first photomask (not shown) using an exposure equipment (not shown), and developing, etching, stripping, or ashing operations.

The semiconductor layer (not shown) may be formed of amorphous silicon or crystalline silicon (polysilicon). The crystalline silicon may be formed by crystallizing amorphous silicon. The amorphous silicon may be crystallized using, for example, a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method.

Figure 8:
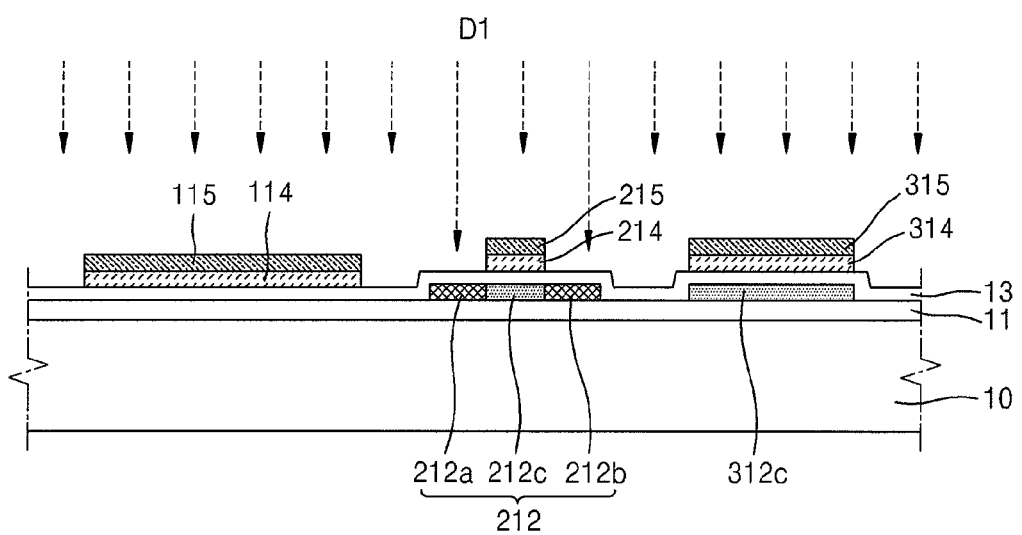

FIG. 8 is a cross-sectional view illustrating the result of a second mask operation of the method of manufacturing the organic light-emitting display device 1 according to an embodiment of the present invention.

Referring to FIG. 8, a first insulation layer 13 may be stacked on a resultant product of the first mask operation of FIG. 1, and layers including transparent conductive materials and metals (not shown) may be sequentially formed on the first insulation layer 13, and then the layers including transparent conductive materials and metals may be patterned at the same time.

As a result of the patterning, a first pixel electrode 114 including a transparent conductive material and a second pixel electrode 115 including a metal may be sequentially formed on the first insulation layer 13 in the pixel area PXL1, and a first gate electrode 214 including a transparent conductive material, and a second gate electrode 215 including a metal may be sequentially formed in the transistor area TFT1, and a first top capacitor electrode 314 including a transparent conductive material and a second top capacitor electrode 315 including a metal may be formed in the capacitor area CAP1 at the same time.

As described above, the first insulation layer 13 may include $SiO_2$ and/or $SiN_x$ as a single layer or a plurality of layers, and the first insulation layer 13 may function as a gate insulation layer of the thin film transistor and a dielectric layer of the capacitor.

The first pixel electrode 114, the first gate electrode 214, and the first top capacitor electrode 314 may be formed of the same transparent conductive material.

The second pixel electrode 115, the second gate electrode 215, and the second top capacitor electrode 315 may be formed of the same metal, and may be formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu), and in a single layer or plurality of layers.

The above stack structure may be doped with ion impurities. For example, B or P ions may be used as the ion impurities. Doping (D1) may be performed on the active layer 212 of the thin film transistor as a target with a concentration of $1 \times 10^{15}$ atoms/cm$^2$ or greater.

The first and second gate electrodes 214 and 215 may be used as a self-aligned mask to dope the active layer 212 with ion impurities. Thus, the active layer 212 can include source and drain areas 212a and 212b doped with ion impurities and a channel area 212c disposed therebetween. That is, by using the first and second gate electrodes 214 and 215 as a self-aligned mask, the source and drain areas 212a and 212b may be formed without using an additional photomask.

According to an embodiment, the bottom capacitor electrode 312c formed of the same material as the active layer 212 is not doped as the channel area 212c because the first and second top capacitor electrodes 314 and 315 function as a blocking mask. However, the wiring unit of the capacitor where the first and second top capacitor electrodes 314 and 315 are not formed may be doped with ion impurities.

Figure 9:
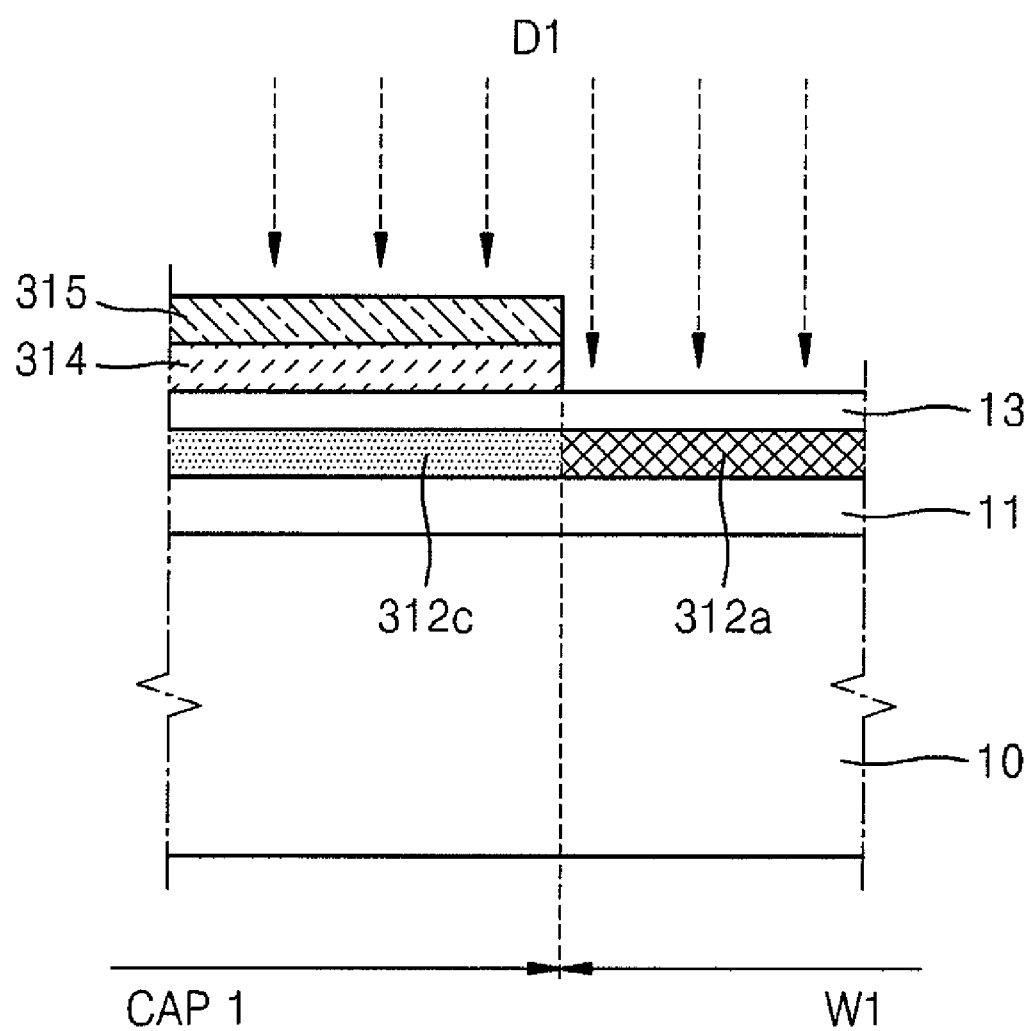

FIG. 9 illustrates the wiring unit W1 that is connected to the bottom capacitor electrode 312c and is doped with ion impurities in the first doping operation after the second mask operation.

Referring to FIG. 9, the bottom capacitor electrode 312c is not doped because it is blocked by the first and second top capacitor electrodes 314 and 315, but the wiring unit W1 is doped with ion impurities (portion 312a).

Figure 10:
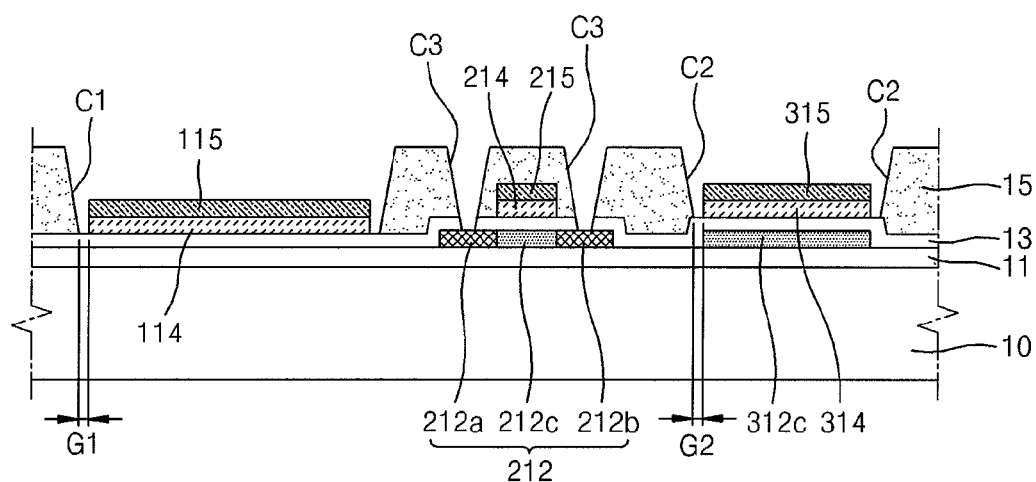

FIG. 10 is a cross-sectional view illustrating a resultant product of a third mask operation of the method of manufacturing the organic light-emitting display device 1 according to an embodiment of the present invention.

Referring to FIG. 10, a second insulation layer 15 may be formed on a resultant product of the second mask operation of FIG. 8, and the second insulation layer 15 may be patterned to form a first contact hole C1 exposing the entire first pixel electrode 114, a second contact hole C2 entirely exposing the first and second top capacitor electrodes 314 and 315, and a third contact hole C3 exposing portions of the source area 212a and the drain area 212b of the active layer 212.

The first contact hole C1 may be formed so as to expose the entire first pixel electrode 114, and a first gap G1 may be formed between an outer side of the first pixel electrode 114 and the inner sidewall of the first contact hole C1. Also, the second contact hole C2 may be formed so as to entirely expose the first and second top capacitor electrodes 314 and 315 of the capacitor, and a second gap G2 may be formed between outer sides of the first and second top capacitor electrodes 314 and 315 and inner sidewalls of the second contact hole C2.

As described above, since the first contact hole C1 may be formed in the second insulation layer 15 to expose the entire first pixel electrode 114, a light-emission area may be enlarged, thereby increasing an aperture ratio.

Figure 11:
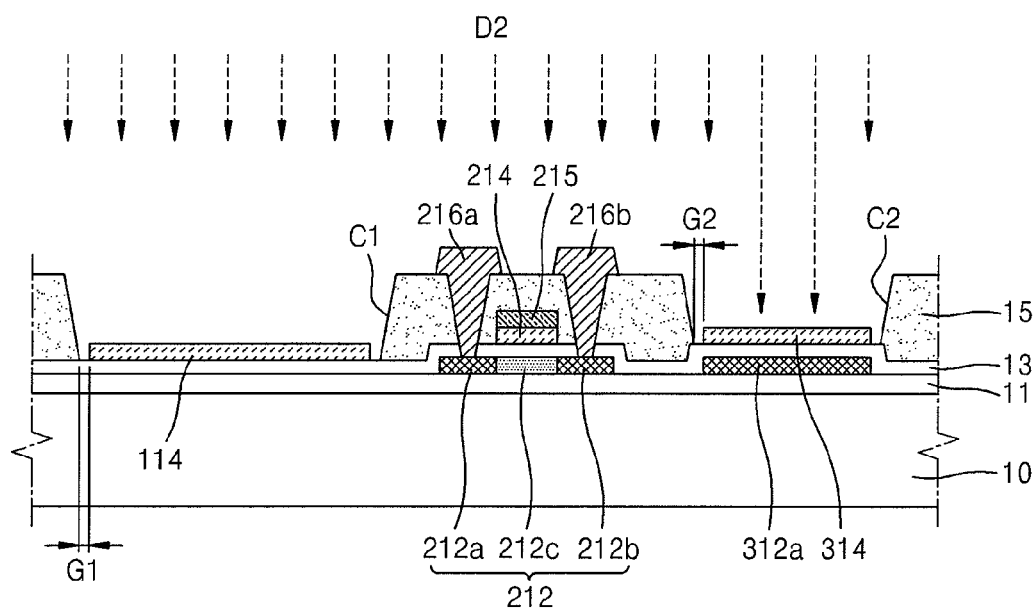

FIG. 11 is a cross-sectional view illustrating a resultant product of a fourth mask operation of the method of manufacturing the organic light-emitting display device 1 according to an embodiment of the present invention.

Referring to FIG. 11, source and drain electrodes 216a and 216b may be formed on the second insulation layer 15. The source and drain electrodes 216a and 216b may each be formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu), in a single layer or a plurality of layers.

While not specifically shown in FIG. 11, the source and drain electrodes 216a and 216b are formed as follows. First, a metal to form the source and drain electrodes 216a and 216b may be formed on the resultant product of the third mask operation of FIG. 10, and then the metal may be patterned by using a fourth photomask (not shown) such that the source and drain electrodes 216a and 216b remain.

When the metal for forming the source and drain electrodes 216a and 216b and a metal for forming the second pixel electrode 115 and the second top capacitor electrode 315 are the same, the source and drain electrodes 216a and 216b may be patterned using a single etchant in one etching operation. If the metal for forming the source and drain electrodes 216a and 216b and the metal for forming the second pixel electrode 115 and the second top capacitor electrode 315 are different, the metal for forming the source and drain electrodes 216a and 216b may be etched using a first etching solution to form patterns of the source and drain electrodes 216a and 216b, and the second pixel electrode 115 and the second top capacitor electrode 315 may be removed using a second etching solution.

Then, the structure formed by the above-described fourth mask operation and the etching operation may be doped with ion impurities. Doping may be performed on the bottom capacitor electrode 312a using B or P ions as ion impurities with an appropriate concentration (D2).

Figure 12:
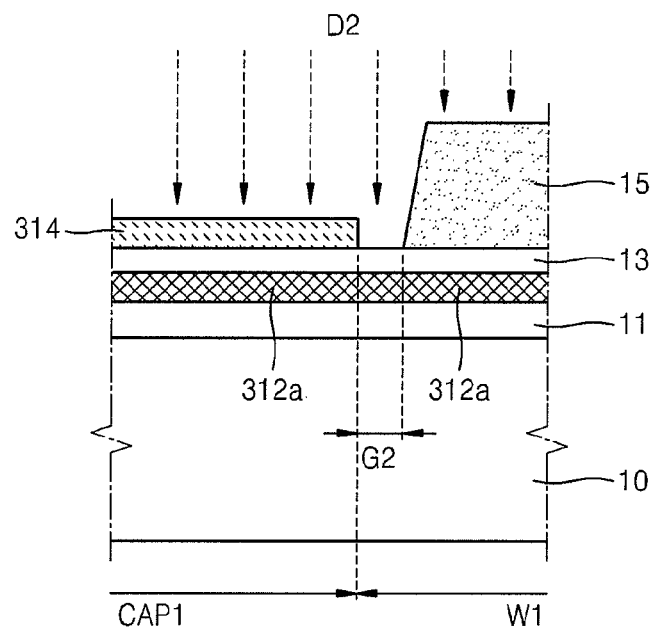

FIG. 12 illustrates the bottom capacitor electrode 312a doped with ion impurities during a second doping operation after the fourth mask operation.

Referring to FIG. 12, the bottom capacitor electrode 312c (see FIG. 9), which is not doped in the first doping operation, may be changed to a bottom capacitor electrode 312a that is doped with ion impurities after the second doping operation. Thus, the conductivity of the bottom capacitor electrode 312a can increase. Accordingly, the bottom capacitor electrode 312a, the first insulation layer 13, and the first top capacitor electrode 314 can form a MIM capacitor structure, thereby increasing the electrostatic capacity of the capacitor.

In addition, since the second contact hole C2 formed in the second insulation layer 15 can expose the entire top capacitor electrode 314, the bottom capacitor electrode 312a and the wiring unit W1 may be both doped with ion impurities. Accordingly, decrease in electrostatic capacity or signal transmission quality may be inhibited.

Figure 14:
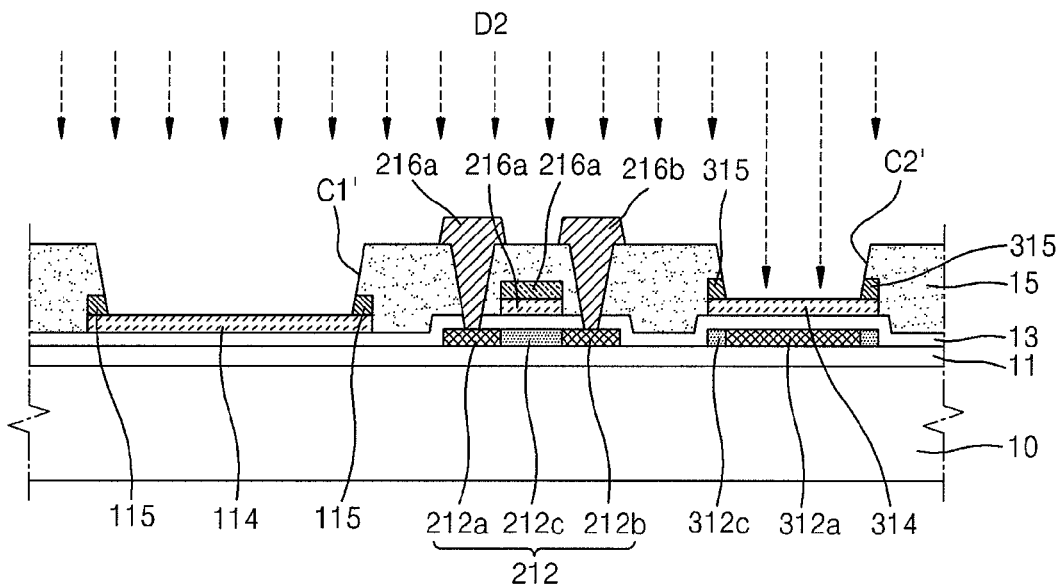
FIGS. 14 and 15 are cross-sectional views illustrating a method of manufacturing the organic light-emitting display device according to a comparative example of the present invention.

FIG. 14 is a cross-sectional view illustrating a fourth mask operation of a method of manufacturing the organic light-emitting display device 2 according to a comparative example of the present invention.

Referring to FIG. 14, a first contact hole C1' and a second contact hole C2' may partially expose the first pixel electrode 114 and the first top capacitor electrode 314. As a result, portions of the second pixel electrode 115 and the second top capacitor electrode 315 may remain on outer portions of the first pixel electrode 114 and the first top capacitor electrode 314, respectively. This structure is not illustrated in FIG. 14 but may be formed in the third mask operation.

Figure 15:
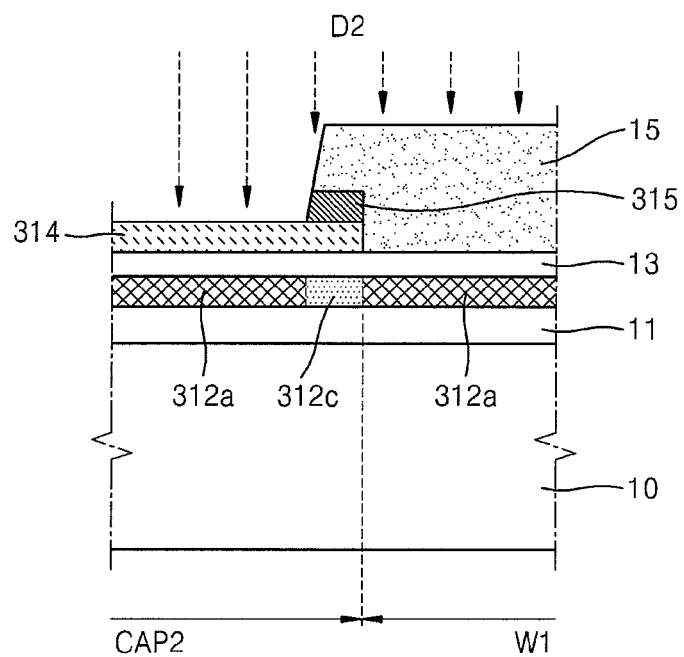

When the above structure is doped with ion impurities, the bottom capacitor electrode 312a that is not blocked by the second top capacitor electrode 315 is doped, but a portion 312c that is blocked by the second top capacitor electrode 315 is not doped, as illustrated in FIG. 15. The portion 312c that is not doped may be part of the bottom capacitor electrode 312a and thus may reduce the total electrostatic capacity of the capacitor or may decrease signal transmission quality of wiring unit W1'.

Figure 13:
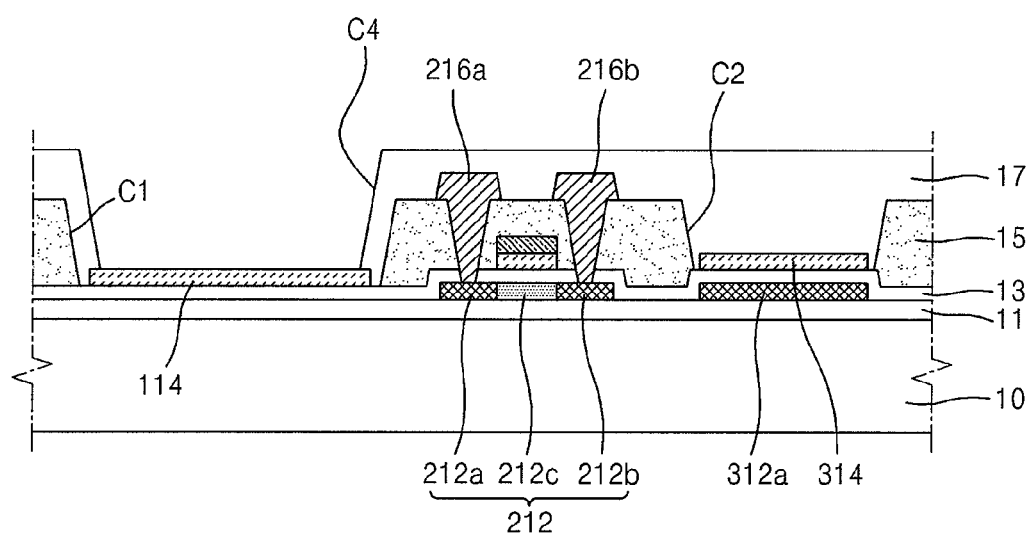

FIG. 13 is a cross-sectional view illustrating a resultant product of a fifth mask operation of the method of manufacturing the organic light-emitting display device 1 according to an embodiment of the present invention.

Referring to FIG. 13, a third insulation layer 17 may be formed on the resultant product of the fourth mask operation of FIG. 11, and the third insulation layer 17 may be patterned to form an opening C4 exposing an upper portion of the first pixel electrode 114.

In addition to defining a light-emission area, the opening C4 can increase the distance between boundaries of the first and second pixel electrodes 114 and 115 and the opposite electrode 119 (see FIG. 1) to prevent the concentration of an electric field on the boundaries of the first pixel electrode 114, thereby preventing a short circuit between the first pixel electrode 114 and the opposite electrode 119.

As described above, the size of the opening C4 may be increased as the size of the first contact hole C1 formed in the second insulation layer 15 is increased. Thus, the length of the emissive layer 118 (see FIG. 1) may be further increased in the bigger opening C4, thereby enlarging the light-emission area and increasing an aperture ratio.

According to an embodiment of the organic light-emitting display device 1 and the method of manufacturing the same, when forming contact holes in the second insulation layer 15 in the third mask operation, the first and second contact holes C1 and C2 may be formed so as to entirely expose the first pixel electrode 114 and the first top capacitor electrode 314, respectively, thereby increasing an aperture ratio, an electrostatic capacity, and signal transmission quality of capacitor wirings.

While the first contact hole C1 and the second contact hole C2 may be respectively formed so as to entirely expose the first pixel electrode 114 and the first top capacitor electrode 314, according to the current embodiment, the present invention is not limited thereto. Alternatively, only either the first contact hole C1 or the second contact hole C2 may be formed to have the above-described structure as necessary.

According to the organic light-emitting display devices and methods of manufacturing the same of the present invention, the following effects can be provided.

First, a surface area of a light-emission area can be increased, thereby increasing an aperture ratio.

Second, bottom capacitor electrodes and wiring units can be inhibited from not being doped with ion impurities, and thus the electrostatic capacity may be increased and signal transmission quality of capacitor wirings improved.

Third, a metal-insulator-metal (MIM) capacitor structure may be provided.

Fourth, the organic light-emitting display device may be manufactured through five mask operations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
    an active layer of a thin film transistor and a bottom capacitor electrode formed over a substrate, wherein the bottom capacitor electrode includes a semiconductor material that is formed on the same layer as the active layer and doped with ion impurities;
    a first insulation layer formed over the substrate to cover the active layer and the bottom capacitor electrode;
    a gate electrode formed over the first insulation layer, wherein the gate electrode comprises a first gate electrode and a second gate electrode that are sequentially stacked on the first insulation layer, wherein the first gate electrode comprises a transparent conductive material, and the second gate electrode comprises a metal;
    a pixel electrode that is formed on the first insulation layer, wherein the pixel electrode comprises a transparent conductive material, and a top capacitor electrode that is formed on the same layer as the pixel electrode, wherein the top capacitor electrode comprises a transparent conductive material;
    source and drain electrodes of the thin film transistor that are electrically connected to the active layer;
    a second insulation layer that is formed between the first insulation layer and the source and drain electrodes and includes a first contact hole exposing the entire top capacitor electrode;
    a third insulation layer that is formed on the second insulation layer and exposes the pixel electrode;
    an emissive layer formed over the pixel electrode; and
    an opposite electrode disposed over and facing the pixel electrode, wherein the emissive layer is disposed between the pixel electrode and the opposite electrode.

2. The organic light-emitting display device of claim 1, wherein the first gate electrode, the pixel electrode, and the top capacitor electrode comprise the same transparent conductive material.

3. The organic light-emitting display device of claim 1, wherein the transparent conductive material includes at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

4. The organic light-emitting display device of claim 1, wherein a gap is formed between an outer side of the top capacitor electrode and an inner sidewall of the contact hole.

5. The organic light-emitting display device of claim 4, wherein a third insulation layer is disposed in the gap.

6. The organic light-emitting display device of claim 1, wherein a capacitor wiring connected to the bottom capacitor electrode is formed on the same layer as the bottom capacitor electrode, wherein the capacitor wiring comprises a semiconductor material doped with ion impurities.

7. The organic light-emitting display device of claim 6, wherein a connection portion between the bottom electrode and the capacitor wiring are doped with ion impurities.

8. The organic light-emitting display device of claim 1, wherein the second insulation layer comprises a second contact hole exposing the entire pixel electrode.

9. The organic light-emitting display device of claim 8, wherein a gap is formed between an outer side of the pixel electrode and an inner sidewall of the second contact hole.

10. The organic light-emitting display device of claim 9, wherein a third insulation layer is disposed in the gap.

11. The organic light-emitting display device of claim 1, wherein the third insulation layer comprises an organic insulation material.

12. The organic light-emitting display device of claim 1, wherein the active layer comprises a semiconductor material doped with ion impurities.

13. The organic light-emitting display device of claim 12, wherein the semiconductor material includes amorphous silicon or crystalline silicon.

14. The organic light-emitting display device of claim 1, wherein the opposite electrode is a reflective electrode that reflects light emitted from the emissive layer.

15. The organic light-emitting display device of claim 1, wherein at least one insulation layer having a different refractive index from the first insulation layer is disposed between the substrate and the first insulation layer.

16. A method of manufacturing an organic light-emitting display device, the method comprising:
    a first mask operation comprising forming a semiconductor layer over a substrate and patterning the semiconductor layer to form an active layer of a thin film transistor and a bottom capacitor electrode;
    a second mask operation comprising forming a first insulation layer over the substrate to cover the active layer and the bottom capacitor electrode, sequentially stacking a transparent conductive material and a first metal on the first insulation layer, and patterning the transparent conductive material and the first metal to simultaneously form a pixel electrode in which the transparent conductive material and the first metal are sequentially stacked, a gate electrode of the thin film transistor, and a top capacitor electrode;
    a third mask operation comprising forming a second insulation layer on a resultant product of the second mask operation and patterning the second insulation layer to form a contact hole entirely exposing the pixel electrode, source and drain areas of the active layer, and the top capacitor electrode;
    a fourth mask operation comprising forming a second metal on a resultant product of the third mask operation, patterning the second metal to form source and drain electrodes respectively contacting the exposed source and drain areas, and removing the first metal formed on the pixel electrode and the top capacitor electrode; and
    a fifth mask operation comprising forming a third insulation layer on a resultant product of the fourth mask operation, wherein the third insulation layer exposes the transparent conductive material of the pixel electrode.

17. The method of claim 16, wherein in the first mask operation, the semiconductor layer is patterned to form a capacitor wiring connected to the bottom capacitor electrode on the same layer as the bottom capacitor electrode at the same time.

18. The method of claim 17, wherein after the second mask operation, the source and drain areas and the capacitor wiring are doped with ion impurities.

19. The method of claim 17, wherein in the third mask operation, a gap is formed between an outer side of the top capacitor electrode and an inner sidewall of the contact hole to expose the entire top capacitor electrode.

20. The method of claim 16, wherein the third mask operation comprises forming the contact hole in the second insulation layer to expose the entire pixel electrode.

21. The method of claim 20, further comprising forming a gap between an outer side portion of the pixel electrode and an inner wall of the contact hole to expose the entire pixel electrode.

22. The method of claim 16, wherein the fourth mask operation comprises a first etching operation etching the second metal and a second etching operation removing the first metal formed on the pixel electrode and the top capacitor electrode.

23. The method of claim 16, wherein in the fourth mask operation, the second metal is formed of the same material as the first metal, and the first metal and the second metal are etched at the same time.

24. The method of claim 16, further comprising, after the fourth mask operation, doping the bottom capacitor electrode with ion impurities.

25. The method of claim 16, further comprising, after the fifth mask operation, forming an emissive layer on the pixel electrode and an opposite electrode on the emissive layer.

* * * * *